(12) United States Patent
Lee et al.

(10) Patent No.: US 10,290,527 B2
(45) Date of Patent: May 14, 2019

(54) METHOD OF MANUFACTURING SEMICONDUCTOR DEVICE BY USING PLASMA ETCHING APPARATUS

(71) Applicant: Samsung Electronics Co., Ltd., Suwon-si, Gyeonggi-do (KR)

(72) Inventors: Jun-soo Lee, Seoul (KR); Jae-hoon Kim, Seoul (KR); Kyung-hak Min, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/924,978

(22) Filed: Mar. 19, 2018

(65) Prior Publication Data
US 2019/0080948 A1 Mar. 14, 2019

(30) Foreign Application Priority Data
Sep. 13, 2017 (KR) .......................... 10-2017-0117234

(51) Int. Cl.
*H01L 21/68* (2006.01)
*H01L 21/67* (2006.01)
(Continued)

(52) U.S. Cl.
CPC ........ *H01L 21/68* (2013.01); *H01J 37/32724* (2013.01); *H01J 37/32743* (2013.01); *H01L 21/3065* (2013.01); *H01L 21/67069* (2013.01); *H01L 21/67103* (2013.01); *H01L 21/6833* (2013.01); *H01L 21/68707* (2013.01); *H01J 2237/20214* (2013.01); *H01J 2237/334* (2013.01)

(58) Field of Classification Search
CPC ........ C25B 11/0478; C25B 1/00; B01J 20/06; B01J 23/8892; B01D 53/326; B01D 2257/404; B01D 2255/402; B01D 2253/1124; B01D 2255/20753; B01D 2255/2073; B01D 2255/2063; B01D 2255/204; B01D 2259/818
See application file for complete search history.

(56) References Cited

U.S. PATENT DOCUMENTS 7,242,204 B2    7/2007  Otaguro et al.
2003/0211740 A1  11/2003  Bang et al.
(Continued)

FOREIGN PATENT DOCUMENTS

JP    2012-146721    8/2012
KR    10-2010-0089647    8/2010
(Continued)

*Primary Examiner* — Duy Vu N Deo
(74) *Attorney, Agent, or Firm* — Myers Bigel, P.A.

(57) ABSTRACT

The inventive concept provides a method of manufacturing a semiconductor device using a plasma etching apparatus including an alignment chamber and a process chamber. The method includes: loading a wafer in the alignment chamber of the plasma etching apparatus; rotating the wafer loaded in the alignment chamber according to a plurality of heating zones arranged in an electrostatic chuck of the process chamber, thereby rotating a reference point of the wafer; transferring the wafer that was rotated in the alignment chamber onto the electrostatic chuck of the process chamber; and plasma-etching the wafer that was rotated in the alignment chamber on the electrostatic chuck of the process chamber.

19 Claims, 16 Drawing Sheets

(51) Int. Cl.
*H01L 21/683* (2006.01)
*H01L 21/3065* (2006.01)
*H01J 37/32* (2006.01)
*H01L 21/687* (2006.01)

(56) References Cited

U.S. PATENT DOCUMENTS

2004/0037458 A1* 2/2004 Peak .................. G06K 9/3216
 382/151
2008/0112780 A1 5/2008 Matano et al.
2009/0087932 A1* 4/2009 Kondoh ............ H01L 21/67196
 438/30

FOREIGN PATENT DOCUMENTS

| KR | 10-1011637 | 1/2011 |
| KR | 10-1362677 | 2/2014 |
| KR | 10-1510224 | 4/2015 |

* cited by examiner

METHOD OF MANUFACTURING SEMICONDUCTOR DEVICE BY USING PLASMA ETCHING APPARATUS

CROSS-REFERENCE TO RELATED APPLICATION

This application claims the benefit of Korean Patent Application No. 10-2017-0117234, filed on Sep. 13, 2017 in the Korean Intellectual Property Office, the disclosure of which is incorporated by reference herein in its entirety.

BACKGROUND

The inventive concept relates to a method of manufacturing a semiconductor device, and more particularly, to a method of manufacturing a semiconductor device by using a plasma etching apparatus.

A plasma etching apparatus may be used to manufacture a semiconductor device. The plasma etching apparatus may plasma-etch a wafer by using plasma in a process chamber. When plasma-etching a wafer in a process chamber is performed by using the plasma etching apparatus, it is difficult to control plasma uniformity on the wafer, and thus, etching uniformity may be reduced.

SUMMARY

The inventive concept provides a method of manufacturing a semiconductor device capable of improving etching uniformity when plasma-etching is performed on a wafer by using a plasma etching apparatus.

According to an aspect of the inventive concept, there is provided a method of manufacturing a semiconductor device using a plasma etching apparatus including an alignment chamber and a process chamber, the method including: loading a wafer in the alignment chamber of the plasma etching apparatus; rotating the wafer loaded in the alignment chamber according to a plurality of heating zones arranged in an electrostatic chuck of the process chamber, thereby rotating a reference point of the wafer; transferring the wafer that was rotated in the alignment chamber onto the electrostatic chuck of the process chamber; and plasma-etching the wafer that was rotated in the alignment chamber on the electrostatic chuck of the process chamber.

According to another aspect of the inventive concept, there is provided a method of manufacturing a semiconductor device by using a plasma etching apparatus including an alignment chamber and a process chamber, the method including: loading a wafer in the alignment chamber of the plasma etching apparatus; obtaining, from a main controller of the plasma etching apparatus, etching distribution data measured from a plurality of comparison wafers that have been plasma-etched in advance in the process chamber; rotating the wafer loaded in the alignment chamber according to the etching distribution data, thereby rotating a reference point of the wafer; transferring the wafer that was rotated in the alignment chamber onto an electrostatic chuck of the process chamber; and plasma-etching the wafer on the electrostatic chuck of the process chamber.

According to another aspect of the inventive concept, there is provided a method of manufacturing a semiconductor device, the method including: loading a wafer into a wafer container of a load port unit of a plasma etching apparatus; transferring the wafer loaded in the wafer container to a first alignment chamber using a first transfer robot; rotating the wafer loaded in the first alignment chamber according to a plurality of heating zones arranged in an electrostatic chuck of a process chamber, thereby rotating a reference point of the wafer; loading the wafer that was rotated in the first alignment chamber into a load lock chamber of the plasma etching apparatus by using the first transfer robot; transferring the wafer from the load lock chamber, using a second transfer robot in a transfer chamber, onto the electrostatic chuck of the process chamber in which the plurality of heating zones are arranged; and plasma-etching the wafer on the electrostatic chuck inside the process chamber.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Below, the inventive concept will now be described more fully with reference to the accompanying drawings, in which example embodiments of the inventive concept are shown. The inventive concept may be implemented by any one of the following embodiments, and the inventive concept may be implemented by combining one or more of the following embodiments. Therefore, the technical idea of the present inventive concept is not limited to only one embodiment.

In this specification, the singular forms of the components may include plural forms unless the context clearly indicates otherwise. In the present specification, the drawings may be exaggerated for clarifying the inventive concept. As used herein the expression "and/or" includes any and all combinations of one or more of the associated listed items.

Figure 1:
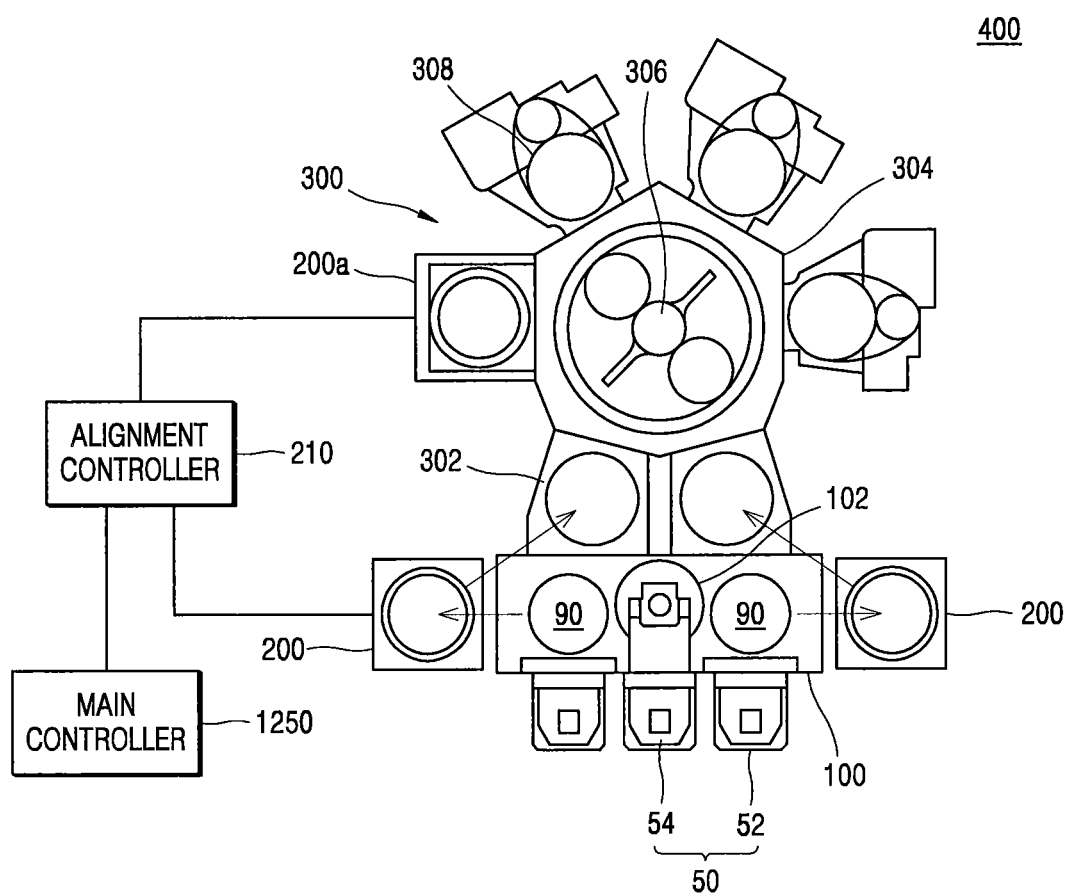
FIG. 1 is a plan view of a plasma etching apparatus for explaining a method of manufacturing a semiconductor device, according to an example of the technical idea of the inventive concept.

FIG. 1 is a plan view of a plasma etching apparatus 400 for explaining a method of manufacturing a semiconductor device according to an example of the technical idea of the inventive concept.

In particular, the plasma etching apparatus 400 may be a cluster system capable of processing a plurality of wafers (or substrates) 90. The cluster system may be referred to as a multi-chambered substrate processing system that includes a transfer robot (or a handler) and a plurality of substrate processing modules arranged around the transfer robot.

The plasma etching apparatus 400 may include a load port unit 50, an equipment front end module 100, a first alignment chamber 200, a second alignment chamber 200a, and manufacturing process equipment 300. The plasma etching apparatus 400 may include the first alignment chamber 200 and the second alignment chamber 200a, or may include only one of the first alignment chamber 200 and the second alignment chamber 200a, as needed.

The load port unit 50 may include a wafer container (or a wafer carrier) 54 and a wafer container support 52 (or a wafer carrier support) in which the wafer container 54 is placed at a front end of the equipment front end module 100. The equipment front end module 100 may be equipped with a first transfer robot 102 which operates at an atmospheric pressure.

The wafer container 54 may use a closed front open unified pod (FOUP) to protect the wafer 90 from foreign objects in the air or chemical contamination during transferring the wafer 90 to a container receiving the wafer 90. The load port unit 50 including a wafer container support 52 on which the wafer container 54 is placed may be installed at the front end of the equipment front end module 100.

The first transfer robot 102 may transfer the wafer 90 between the wafer container 54 in a FOUP form and a load lock chamber 302 of the manufacturing process equipment 300.

The first transfer robot 102 may transfer the wafer 90 between the wafer container 54 and the first alignment chamber 200, or between the first alignment chamber 200 and the load lock chamber 302. For example, the first transfer robot 102 may transfer the wafer 90 from the wafer container 54 to the first alignment chamber 200 as indicated by arrows in FIG. 1, and then, may transfer the wafer 90 from the first alignment chamber 200 to the load lock chamber 302.

The first alignment chamber 200 may be located on one side or both sides of the equipment front end module 100 and may be separately installed. The first alignment chamber 200 may be partially inserted into the equipment front end module 100. An alignment controller 210 may control and/or be connected to the first alignment chamber 200. In the first alignment chamber 200, the wafer 90 may be rotated according to heating zones on an electrostatic chuck inside a process chamber 308 by using the alignment controller 210, so that an etching uniformity is improved.

In addition, a main controller 1250 of the plasma etching apparatus 400 may control and/or be connected to the alignment controller 210. In the first alignment chamber 200, the wafer 90 may be rotated according to etching distribution data measured on or from a plurality of comparison wafers which have been plasma-etched in advance in the process chamber 308 by using the main controller 1250 and the alignment controller 210, so that the etching uniformity is improved.

In the first alignment chamber 200, the wafer 90 may be rotated by using the main controller 1250 and the alignment controller 210, according to critical dimension measurement positions after plasma-etching has been performed. As described above, the wafer 90 in the first alignment chamber 200 may be rotated on a basis of heating zones in the electrostatic chuck, the etching distribution data measured on the comparison wafer, and/or the critical dimension measurement positions. The critical dimension measurement positions may be previously determined or predetermined on the wafer 90.

The manufacturing process equipment 300 may include the load lock chamber 302, a transfer chamber 304, and the process chamber 308. The manufacturing process equipment 300 may include the transfer chamber 304 capable of transferring the wafer 90, for example, a wafer of about 300 mm diameter, and a plurality of process chambers 308 for a plasma-etching process, for example, for a dry etch process of the wafer 90. The transfer chamber 304 may include a second transfer robot 306 capable of free rotation. Process chambers 308 for performing the plasma-etching process of the wafer 90, two load lock chambers 302, and the second alignment chamber 200a may be connected to certain sides (e.g., different sides) of the transfer chamber 304.

The wafer 90 loaded in the load lock chamber 302 may be loaded into the second alignment chamber 200a by using the second transfer robot 306. The alignment controller 210 may control and/or be connected to the second alignment chamber 200a. In the second alignment chamber 200a, the wafer 90 may be rotated by using the alignment controller 210, according to the heating zones on the electrostatic chuck inside the process chamber 308, so that the etching uniformity is improved.

In the second alignment chamber 200a, the wafer 90 may be rotated by using the main controller 1250 and the alignment controller 210, according to etching distribution data measured on the plurality of comparison wafers which have been plasma-etched in advance in the process chamber 308, so that the etching uniformity is improved.

In the second alignment chamber 200a, the wafer 90 may be rotated by the main controller 1250 and the alignment controller 210, according to the critical dimension measurement positions after the plasma-etching has been performed. As described above, the wafer 90 in the second alignment chamber 200a may be rotated on a basis of the heating zones on the electrostatic chuck, the etching distribution data measured on the comparison wafers, and/or the critical dimension measurement positions. In addition, the etching distribution data obtained from the main controller 1250 of the plasma etching apparatus 400 may be fed back to the alignment controller 210 by software, so that a rotation angle of the wafer 90 may be automatically adjusted.

The wafer 90 having passed through at least one of the first alignment chamber 200 and the second alignment chamber 200a may be loaded into the process chamber 308 by using the second transfer robot 306 and may be plasma-etched. Since the wafer 90 having passed through at least one of the first alignment chamber 200 and the second alignment chamber 200a has been rotated according to the heating zones the electrostatic chuck, for example, the etching uniformity may be improved.

The wafer 90 to be processed in the plasma etching apparatus 400 may be typically used for manufacturing a semiconductor circuit. In addition to the illustrated configuration of the plasma etching apparatus 400, a number of processing systems may be needed to perform all of the processes required for a complete fabrication of integrated circuits or chips. However, in the interest of brevity and for clarity of the inventive concept, a description of a conventional configuration or a configuration that can be understood by one of ordinary skill in the art is omitted herein.

The load lock chamber 302 may form a vacuum atmosphere identical or close to that of the transfer chamber 304 at the time the second transfer robot 306 of the transfer chamber 304 loads or unloads the wafer 90, and may be provided with unprocessed wafers from the equipment front end module 100. When the wafer 90 processed beforehand is transferred to the equipment front end module 100, the load lock chamber 302 may be kept at an atmospheric pressure.

The load lock chamber 302 may maintain pressure while the pressure thereof alternates between a vacuum state and an atmospheric pressure state by itself, so that a pressure state in the transfer chamber 304 is prevented from being changed. Although not shown, a buffer stage in which the wafer 90 temporarily is held may be installed in the load lock chamber 302.

The wafer 90 plasma-etched in the process chamber 308 may be transferred into the load lock chamber 302 in the vacuum state by the second transfer robot 306 of the transfer chamber 304. The wafer 90 transferred to the load lock chamber 302 may be transferred to the wafer container 54 by using the first transfer robot 102.

Figure 2:
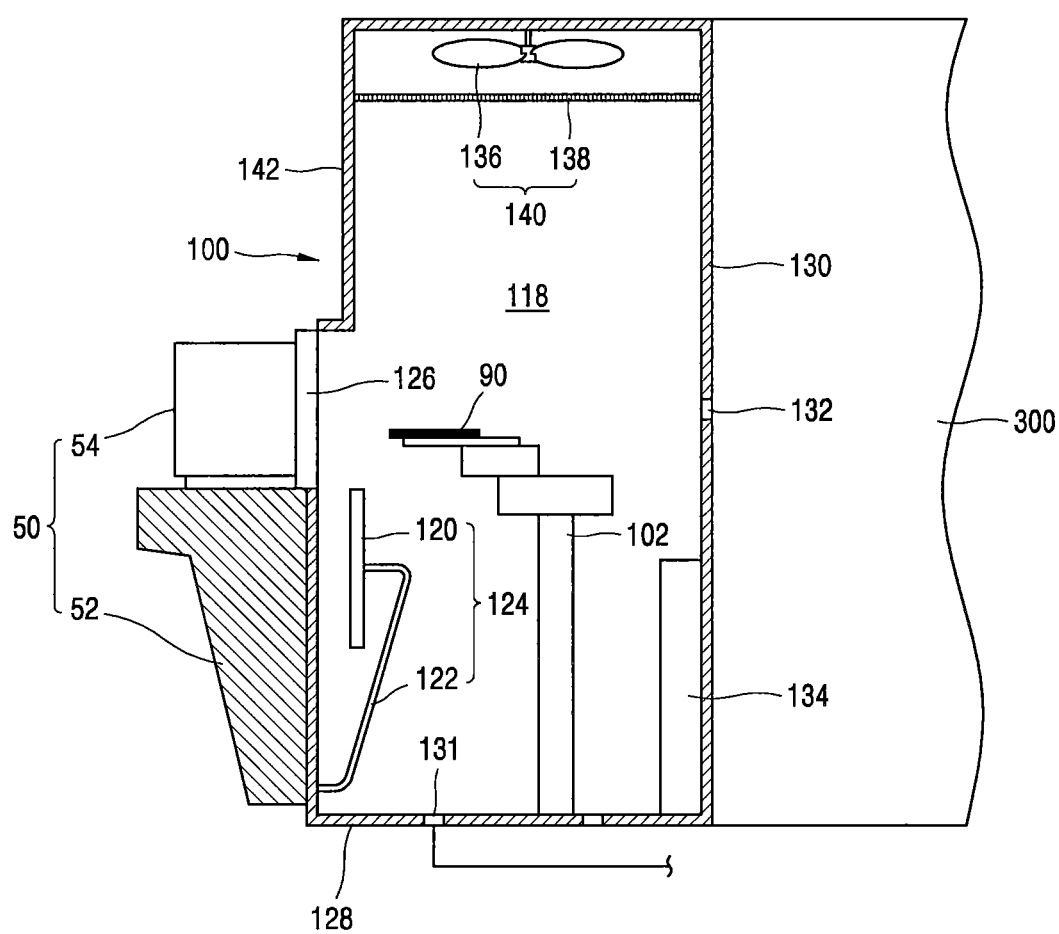
FIG. 2 is a cross-sectional view of a plasma etching apparatus for explaining a method of manufacturing a semiconductor device, according to an example of the technical idea of the inventive concept.
Figure 3:
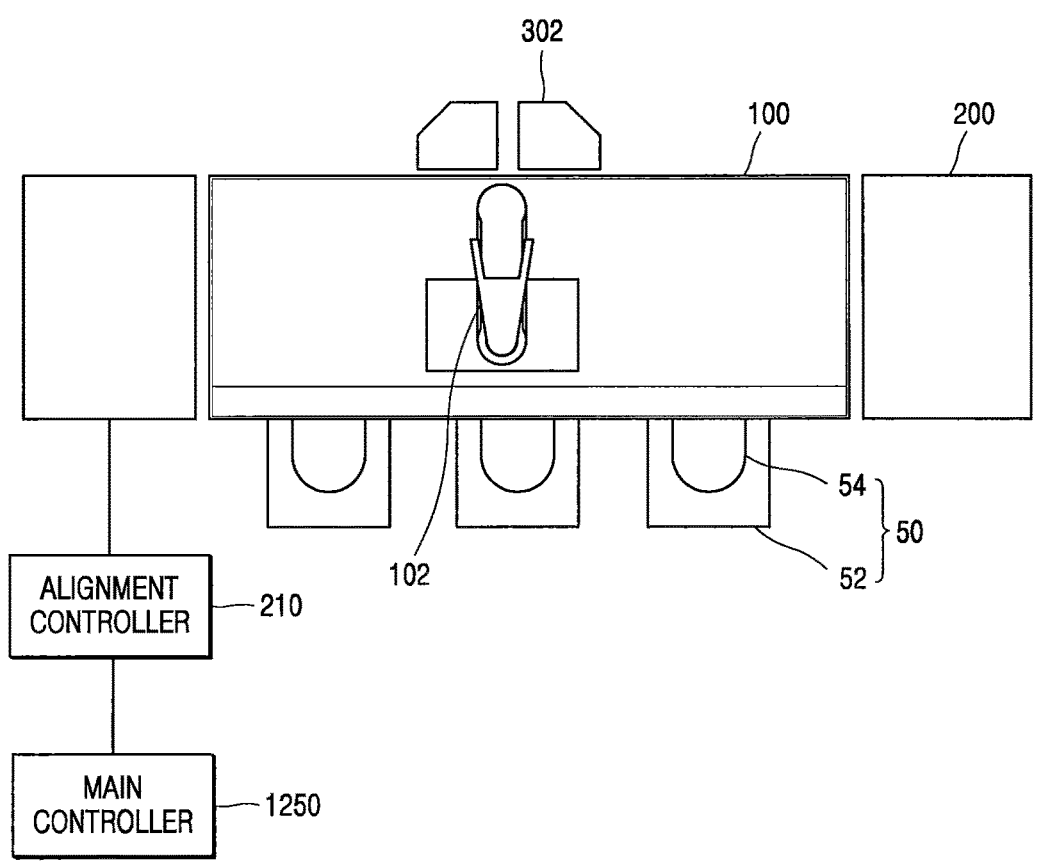
FIG. 3 is a plan view of a load port unit, an equipment front end module, and a first alignment chamber of a plasma etching apparatus for explaining a method of manufacturing a semiconductor device, according to an example of the technical idea of the inventive concept.

FIG. 2 is a cross-sectional view of the plasma etching apparatus 400 for explaining a method of manufacturing a semiconductor device, according to an example of the technical idea of the inventive concept. FIG. 3 is a plan view of the load port unit 50, the equipment front end module 100, and the first alignment chamber 200 of the plasma etching apparatus 400 for explaining a method of manufacturing a semiconductor device according to an example of the technical idea of the inventive concept.

The plasma etching apparatus 400 may include the load port unit 50, the equipment front end module 100, the manufacturing process equipment 300, and the first alignment chamber 200, as described above. The load port unit 50 may include the wafer container 54 and the wafer container support 52 on which the wafer container 54 is placed, at the front end of the equipment front end module 100, as described above.

The equipment front end module 100 may be used for transferring the wafer 90 between the wafer container 54 and the manufacturing process equipment 300. The equipment front end module 100 may include a housing 128 having an internal space 118, a cleaning unit 140, and the first transfer robot 102. The housing 128 may have a rectangular parallelepiped shape. An inlet port 132, a passage for transferring the wafers 90, may be formed in or on a rear wall 130 of the housing 128, which is adjacent the manufacturing process equipment 300, and an opening may be formed in or on a front side 142 of the housing 128.

The cleaning unit 140 may be at a top or upper portion of the housing 128 to help maintain the inside of the housing 128 at a constant cleanliness. The cleaning unit 140 may include a fan 136 and a filter 138 arranged at the top portion of the housing 128. The fan 136 may cause air to flow from the top portion to the bottom portion inside the housing 128 and the filter 138 may filter the air by removing particles in the air.

An exhaust port 131, an exhaust passage for the air, may be formed on a bottom side of the housing 128. The air may be vented naturally or forcibly by a pump. The first transfer robot 102 may transfer the wafer 90 between the load port unit 50 and the manufacturing process equipment 300, and may be controlled by a robot controller 134. One or more transfer robots may be installed, and may be arranged inside the housing 128.

A door 126 of the wafer container 54 may be arranged at an opening in the front side 142 of the housing 128. A door opener 124 for opening the door 126 of the wafer container 54 may be installed inside the housing 128. The door opener 124 may include a door holder 120, an arm 122, and a driving unit. The door holder 120 may have a size and a shape corresponding to the door 126. The arm 122 may be firmly combined or connected to a rear surface of the door holder 120 and may be driven by the driving unit.

As illustrated in FIG. 3, the load port unit 50 including the wafer container 54 and the wafer container support 52 may be arranged at the front end of the equipment front end module 100 including the first transfer robot 102. The load lock chamber 302 of the manufacturing process equipment 300 may be arranged at a back or rear end of the equipment front end module 100.

The first alignment chamber 200 may be arranged at one end or side of the equipment front end module 100. The first alignment chamber 200 may be partially inserted into or received in the housing 128 of the equipment front end module 100. As described above, the alignment controller 210 and the main controller 1250 may control and/or be connected to the first alignment chamber 200.

In the first alignment chamber 200, the wafer 90 may be rotated according to the heating zones on the electrostatic chuck inside the process chamber 308 by using the alignment controller 210, so that the etching uniformity is improved.

In the first alignment chamber 200, the wafer 90 may be rotated by using the main controller 1250 and the alignment controller 210, according to etching distribution data measured on the plurality of comparison wafers which have been plasma-etched in advance in the process chamber 308, so that the etching uniformity is improved. In other words, the etching distribution data obtained from the main controller 1250 of the plasma etching apparatus 400 may be fed back to the alignment controller 210 by software, so that the rotation angle of the wafer 90 may be automatically adjusted.

Figure 4:
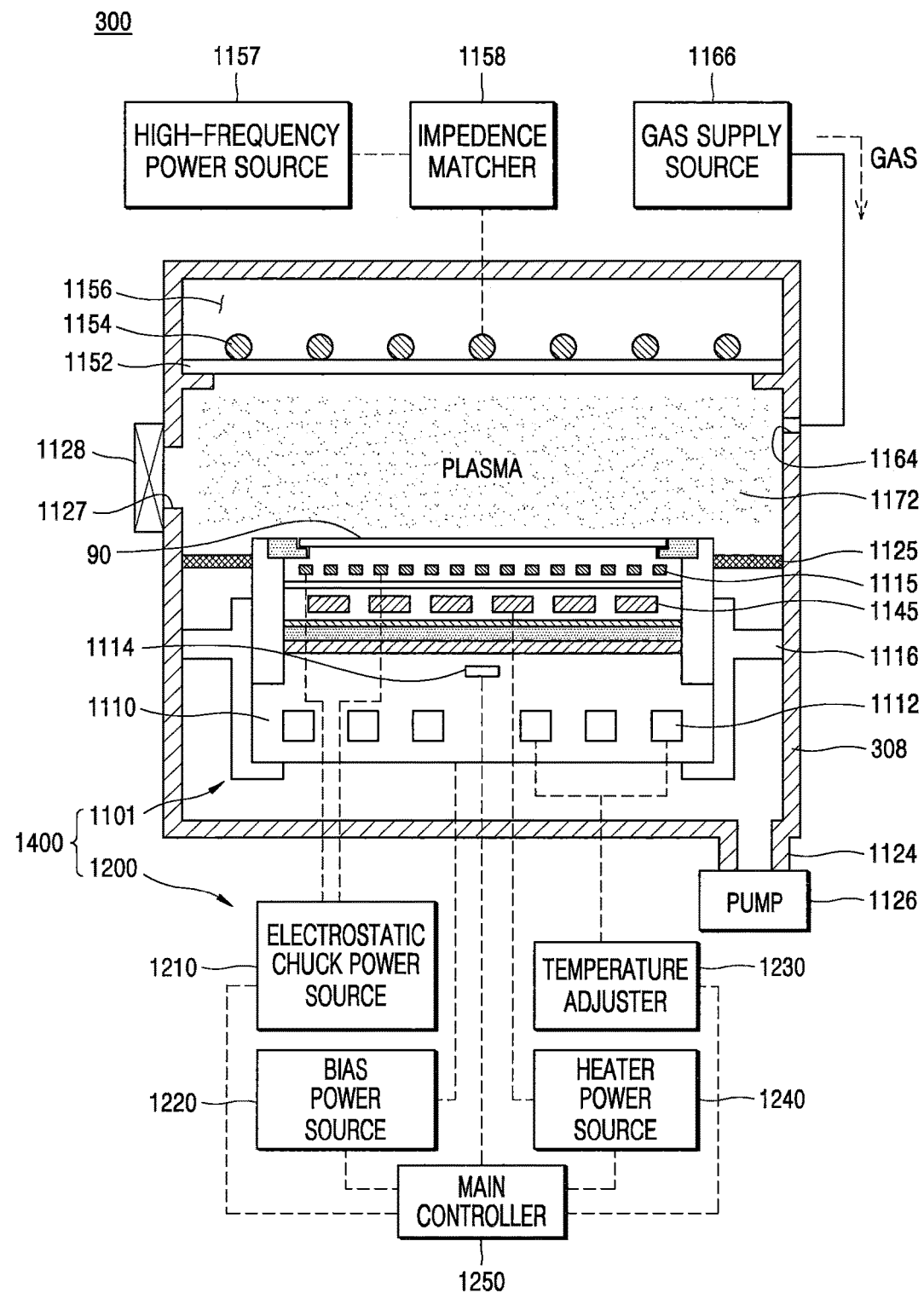
FIG. 4 is a cross-sectional view of manufacturing process equipment of the plasma etching apparatus illustrated in FIGS. 1 through 3.
Figure 5:
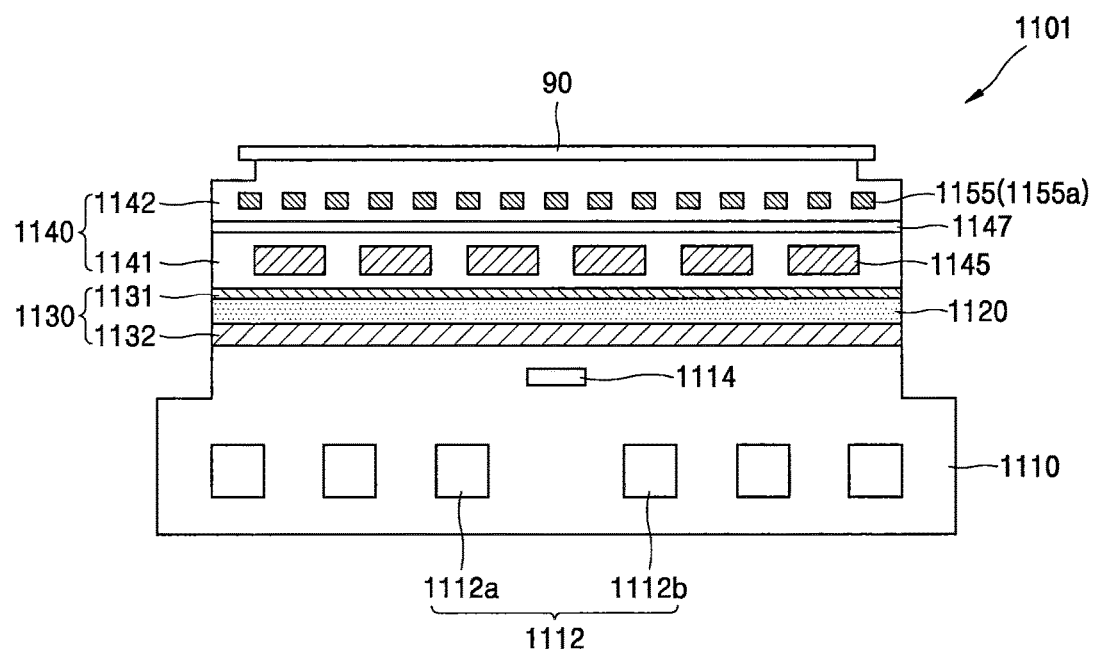
FIG. 5 is a cross-sectional view of an electrostatic chuck in FIG. 4.

FIG. 4 is a cross-sectional view of the manufacturing process equipment 300 of the plasma etching apparatus 400 illustrated in FIGS. 1 through 3. FIG. 5 is a cross-sectional view of an electrostatic chuck 1101 in FIG. 4.

FIG. 4 is an illustration for explaining the manufacturing process equipment 300, particularly the process chamber 308 and the electrostatic chuck 1101 included in the plasma etching apparatus 400 of FIGS. 1 through 3. FIG. 5 is an illustration for explaining the electrostatic chuck 1101 of FIG. 4 in more detail. The manufacturing process equipment 300 may be plasma processing equipment for etching the wafer 90 mounted on the electrostatic chuck 1101 by using inductively coupled plasma (ICP) which is plasma generated in an inductively coupled manner. The electrostatic chuck 1101 may also be used in an etching process apparatus which uses charge coupled plasma (CCP) which is plasma generated in a charge coupled manner.

The manufacturing process equipment 300 may include an electrostatic chuck assembly 1400 which includes the electrostatic chuck 1101 for mounting the wafer 90 at the center of the bottom of the process chamber 308 having a cylindrical shape. The electrostatic chuck assembly 1400 may include the electrostatic chuck 1101 that grips the wafer 90, for example, a silicon wafer, and a control unit 1200 that controls an operation of the electrostatic chuck 1101.

The electrostatic chuck 1101 may include a base 1110 and a dielectric stack 1140 bonded to the base 1110 by an adhesive layer 1130 as shown in FIGS. 4 and 5. The dielectric stack 1140 may include a heater dielectric layer 1141 and an electrostatic dielectric layer 1142, which are sequentially stacked on the base 1110.

The adhesive layer 1130 may have a double-layer structure including a first adhesive 1131 and a second adhesive 1132. A metal plate 1120 may be further provided between the first adhesive 1131 and the second adhesive 1132. The base 1110 may have a circular or disc shape including a metal such as aluminum (Al), titanium (Ti), stainless steel, tungsten (W), or an alloy thereof.

The electrostatic chuck 1101 may be used in the plasma etching apparatus 400 for etching the wafer 90 by using plasma. In this case, the inside of the process chamber 308 in which the electrostatic chuck 1101 is installed may be prepared in a high temperature environment, and when the wafer 90 is exposed to high-temperature plasma, a damage such as ion bombardment may occur to the wafer 90. It may be necessary to cool the wafer 90 to avoid the damage to the wafer 90 and for a uniform plasma treatment.

The base 1110 may further be provided with a coolant channel 1112 through which a coolant flows for cooling the wafer 90. The coolant may include, for example, water, ethylene glycol, silicone oil, liquid Teflon, and a mixture of water and glycol. The coolant channel 1112 may have a concentric or helical pipe structure around a central axis of the base 1110.

The coolant channel 1112 may include an inlet 1112*a* and an outlet 1112*b* through which coolant flows in and flows out, respectively, as shown in FIG. 5, and the inlet 1112*a* and the outlet 1112*b* may be connected to a temperature adjuster 1230. Flow rate and temperature of the coolant circulating in the coolant channel 1112 may be adjusted by the temperature adjuster 1230.

The base 1110 may be electrically connected to a bias' power source 1220 of the control unit 1200. A high-frequency or radio frequency may be applied to the base 1110 from the bias power source 1220 so that the base 1110 serves as an electrode for generating plasma.

The base 1110 may further include a temperature sensor 1114 as shown in FIGS. 4 and 5. The temperature sensor 1114 may transmit a measured temperature of the base 1110 to the main controller 1250 of the control unit 1200. A temperature of the electrostatic chuck 1101, for example, a temperature of the electrostatic dielectric layer 1150 or the wafer 90 may be predicted based on the measured temperature from the temperature sensor 1114.

The heater dielectric layer 1141 may include a heater electrode 1145 embedded therein. The heater dielectric layer 1141 may include a dielectric such as a ceramic, for example, an aluminum oxide layer ($Al_2O_3$), an aluminum nitride layer (AlN), and an yttrium oxide layer ($Y_2O_3$), or a resin such as polyimide. The heater dielectric layer 1141 may have a circular or disc shape.

The heater electrode 1145 may include a conductive material such as W, copper (Cu), nickel (Ni), molybdenum (Mo), Ti, a Ni-chromium (Cr) alloy, and a Ni—Al alloy, or conductive ceramics such as tungsten carbide (WC), molybdenum carbide (MoC), and titanium nitride (TiN).

The heater electrode 1145 may be electrically connected to a heater power source 1240 of the control unit 1200. The heater electrode 1145 may be heated by a power, for example, an alternating current (AC) voltage from the heater power source 1240 so that the temperature of the electrostatic chuck 1101 and/or the wafer 90 may be adjusted. The heater electrode 1145 may have a concentric or spiral pattern with respect to the center axis of the heater dielectric layer 1141.

The electrostatic dielectric layer 1142 may include grip electrodes 1155 embedded therein. The grip electrode 1155 may be referred to as a clamp electrode. The electrostatic dielectric layer 1142 may include a dielectric such as a ceramic, for example, an $Al_2O_3$ layer, an AlN layer, and an $Y_2O_3$ layer, or a resin such as polyimide. The electrostatic dielectric layer 1142 may be circular or disc-shaped.

The wafer 90 may be arranged on the electrostatic dielectric layer 1142. The grip electrode 1155 may include a conductive material such as W, Cu, Ni, Mo, Ti, a Ni—Cr alloy, and a Ni—Al alloy, or conductive ceramics such as WC, MoC, and TiN.

The grip electrode 1155 may be electrically connected to an electrostatic chuck power source 1210 of the control unit 1200. An electrostatic force may be generated between the grip electrode 1155 and the wafer 90 by a power, for example, a DC voltage applied from the electrostatic chuck power source 1210, so that the wafer 90 is gripped onto the electrostatic dielectric layer 1142. As shown in FIG. 5, the grip electrode 1155 may include a plurality of sub-grip electrodes 1155*a* that are spaced apart from each other in the electrostatic dielectric layer 1142.

The dielectric stack 1140 may optionally further include a heat distribution layer 1147 between the heater dielectric layer 1141 and the electrostatic dielectric layer 1142. The heat distribution layer 1147 may include an MN layer, a boron nitride (BN) layer, a W layer, a Mo layer, or the like having a thermal conductivity of about 10 W/mK or more. The heat distribution layer 1147 may serve to more evenly distribute the heat generated in the heater electrode 1145.

The electrostatic chuck power source 1210, the bias power source 1220, the heater power source 1240, and the temperature adjuster 1230 may be controlled by the main controller 1250. For example, the main controller 1250 may read the temperature of the electrostatic chuck 1101 or the wafer 90 based on the temperature measured by the temperature sensor 1114, and may adjust an amount of heat generated from the heater electrode 1145 by adjusting the power of the heater power source 1240. Thus, the temperature of the electrostatic chuck 1101 and/or the wafer 90 may be appropriately controlled.

The electrostatic chuck 1101 may have a step structure suitable for applying a uniform electric field to the wafer 90. The electrostatic dielectric layer 1142 may be combined to or with the heater dielectric layer 1141 without an aid of an adhesive layer. The heater dielectric layer 1141 may be bonded to the base 1110 by the adhesive layer 1130 having a double-layer structure.

The electrostatic chuck 1101 may be supported by a support unit 1116 fixed to an inner wall of the process chamber 308. A baffle plate 1125 may be between the electrostatic chuck 1101 and the inner wall of the process chamber 308. An exhaust pipe 1124 may be provided on a bottom or lower portion of the process chamber 308 and may be connected to a vacuum pump 1126. A gate valve 1128 which opens and closes an opening 1127 defined in an outer wall of the process chamber 308 and may be used for carrying in and carrying out the wafer 90 may be provided on the outer wall of the process chamber 308.

A dielectric window 1152, spaced apart from the electrostatic chuck 1101, may be provided on a ceiling or upper portion of the process chamber 308. An antenna chamber 1156, which accommodates a high-frequency antenna 1154 that may have a coil shape such as a spiral or concentric circle and be arranged over the dielectric window 1152, may be integrated with the process chamber 308. The high-frequency antenna 1154 may be electrically connected to a high-frequency (or radio frequency) power source 1157 for generating plasma via an impedance matcher 1158. The high-frequency power source 1157 may output a high-frequency power suitable for generating plasma. The impedance matcher 1158 may be provided for matching impedance of the antenna chamber 1156 with a load, for example, the impedance of the high-frequency antenna 1154.

A gas supply source 1166 may supply a process gas, for example, an etching gas to the process chamber 308 via a supply device 1164 such as a nozzle or a port or a hole arranged in or on the sidewall of the process chamber 308. The gate valve 1128 may be opened to perform the etching process so that the wafer 90 is loaded (or mounted) onto the electrostatic chuck 1101 in the process chamber 308. The wafer 90 may be gripped onto the electrostatic chuck 1101 by the electrostatic force generated by the power applied from the electrostatic chuck power source 1210 to the electrostatic chuck 1101.

The etching gas may be introduced from the gas supply source 1166 into the process chamber 308. At this time, the pressure inside the process chamber 308 may be set to a certain value by using the vacuum pump 1126. Power may be applied from the antenna chamber 1156 to the high-frequency antenna 1154 via the impedance matcher 1158. In addition, power may be applied from the bias power source 220 to the base 1110.

The etching gas introduced into the process chamber 308 may be uniformly diffused in a process chamber or space 1172 under the dielectric window 1152. A magnetic field may be generated around the high-frequency antenna 1154 by the current flowing through the high-frequency antenna 1154 and a magnetic force line may pass through the dielectric window 1152 and then through the process chamber 1172. An induced electric field may be generated due to a temporal change of the magnetic field and electrons accelerated thereby may collide with molecules or atoms of the etching gas to generate plasma.

As described above, ions of plasma may be supplied to the wafer 90 by using a plasma generating unit so that wafer processing, that is, etching processing, is performed in the process chamber 308. The plasma generating unit may include the gas supply source 1166 for supplying a processing gas to the process chamber 1172, the high-frequency antenna 1154 provided in the antenna chamber 1156, and the high-frequency power source 1157 supplying high-frequency power to the high-frequency antenna 1154.

Figure 6A:
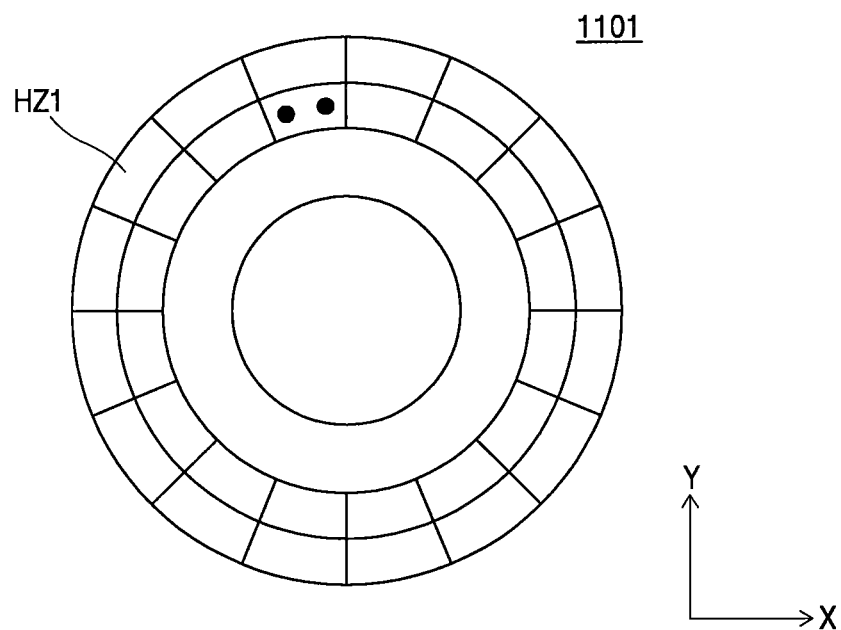
FIGS. 6A and 6B are plan views of electrostatic chucks for explaining heating zones of the electrostatic chuck in FIG. 4.
Figure 6B:
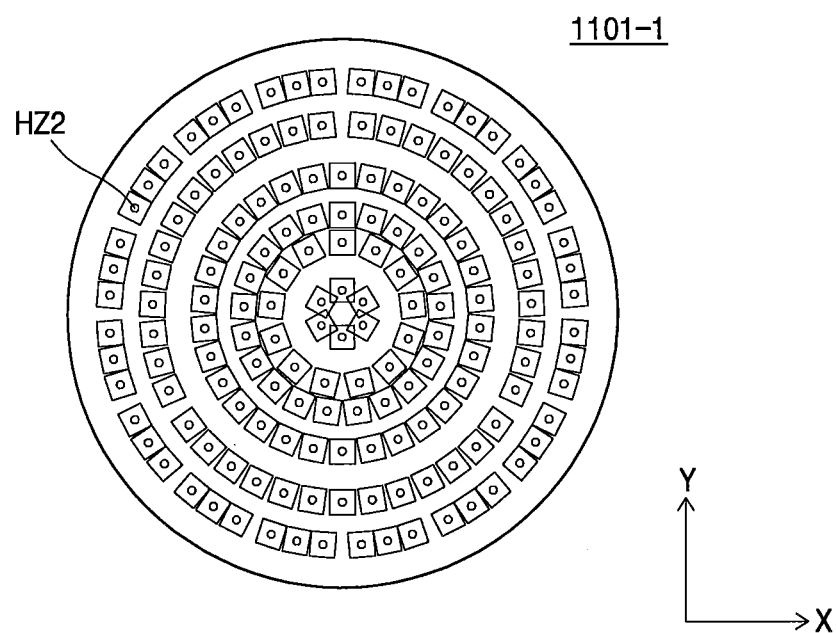
Figure 7:
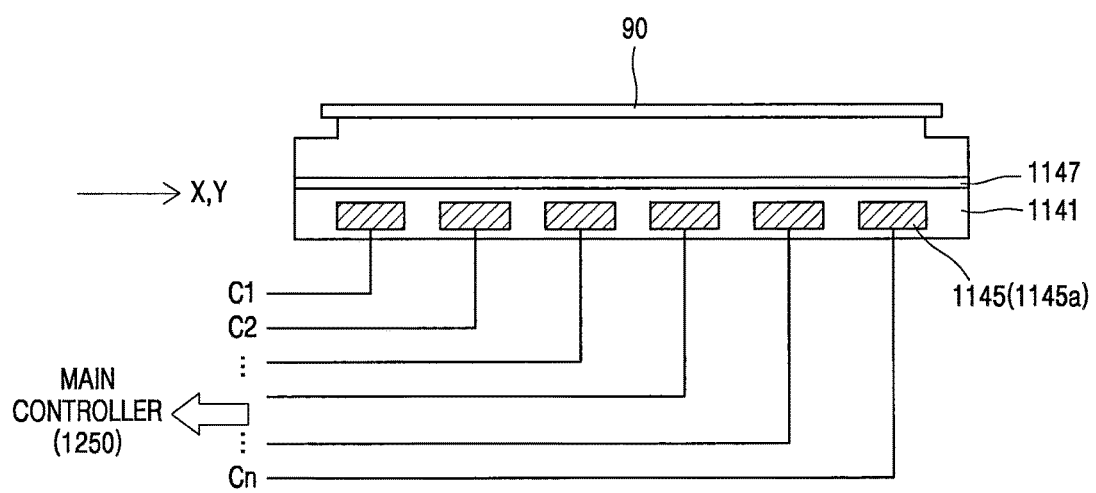
FIG. 7 is a cross-sectional view for explaining temperature control of an electrostatic chuck by using a heater electrode of FIG. 6B.

FIGS. 6A and 6B are plan views of electrostatic chucks 1101 and 1101-1, respectively, for explaining heating zones of the electrostatic chuck 1101 in FIG. 4. FIG. 7 is a cross-sectional view for explaining temperature control of an electrostatic chuck 1101-1 by using the heating zones in FIG. 6B.

The electrostatic chuck 1101 illustrated in FIG. 6A may have dozens of, for example, about 34, heating zones HZ1. The electrostatic chuck 1101-1 of FIG. 6B may have hundreds of, for example, about 158, heating zones HZ2. The electrostatic chucks 1101 and 1101-1 illustrated in FIGS. 6A and 6B may respectively have the heating zones HZ1 and HZ2, which form or have a concentric shape or shapes.

Shapes and an arrangement of the heating zones HZ1 and HZ2 may be variously changed as needed. The heating zones HZ1 and HZ2 may be changed depending on the shape or the arrangement of the heater electrodes (1145 in FIGS. 4 and 5). When comparing the numbers of the heating zones HZ1 and HZ2, the electrostatic chuck 1101-1 illustrated in FIG. 6B may be more precisely controlled than the electrostatic chuck 1101 illustrated in FIG. 6A by using the main controller 1250.

Illustratively, the temperature control of the electrostatic chuck 1101 will be described by using the heater electrode 1145 in an X direction or a Y direction in FIG. 6B with reference to FIG. 7. The wafer 90 may be mounted on the heater dielectric layer 1141. The heater electrode 1145 may be arranged in the heater dielectric layer 1141. The heater electrodes 1145 may include a plurality of sub-heater electrodes 1145a that are spaced apart from each other in the X direction and/or the Y direction perpendicular to the X direction in the heater dielectric layer 1141.

The arrangement of the sub-heater electrodes 1145a in the X direction and the Y direction may be variously configured. When the arrangement of the sub-heater electrodes 1145a is variously configured, the temperature of the electrostatic chuck 1101 may be properly controlled. The sub-heater electrodes 1145a may be connected to the main controller 1250 via electric wires or wirings C1 through Cn (n is an integer).

Voltages of different magnitudes from each other may be applied to the electric wirings C1 through Cn of the sub-heater electrodes 1145a by using the main controller 1250, so that the temperature of the heating zones HZ1 and HZ2 is controlled. In other words, magnitudes of voltages applied to the electric wirings C1 through Cn may be different from each other by using the main controller 1250, so that the temperature of the heating zones HZ1 and HZ2 corresponding to the sub-heater electrodes 1145a is controlled.

In addition, as described above in the inventive concept, the temperature of the electrostatic chucks 1101 and 1101-1 may be precisely controlled by rotating the wafer 90 before loading the wafer 90 into the process chamber 308, without changing the number or the arrangement of the heating zones HZ1 and HZ2 of the electrostatic chucks 1101 and 1101-1, respectively.

Figure 8:
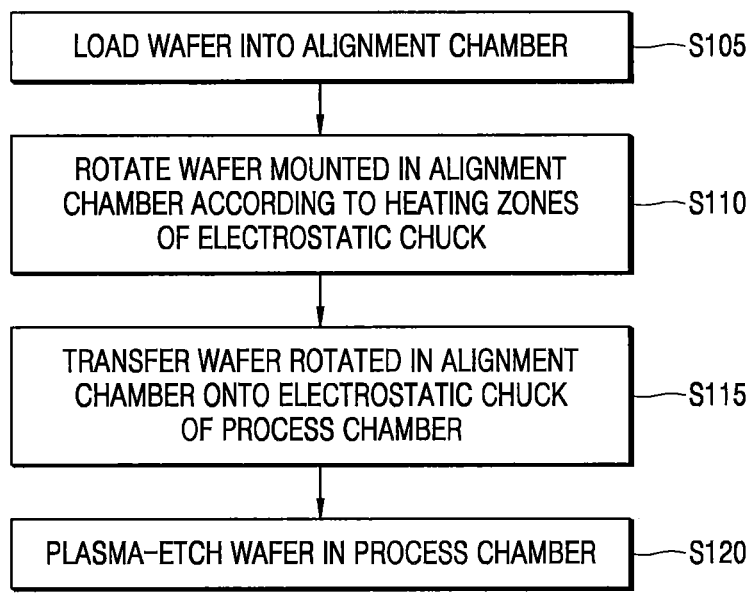
FIG. 8 is a flowchart for explaining a method of manufacturing a semiconductor device by using a plasma etching apparatus, according to an example of the technical idea of the inventive concept.

FIG. 8 is a flowchart for explaining a method of manufacturing a semiconductor device by using the plasma etching apparatus 400 according to an example of the technical idea of the inventive concept.

In the description with respect to FIG. 8, the same reference numerals as those in FIGS. 1 through 7 may denote the same elements. In the description with respect to FIG. 8, the same contents as those described with reference to FIGS. 1 through 7 may be briefly explained or omitted in the interest of brevity. The method of manufacturing a semiconductor device (S100) may be performed by using the plasma etching apparatus 400 including the first alignment chamber 200 and the process chamber 308. With reference to FIG. 8, it is described that the first alignment chamber 200 may be used to manufacture a semiconductor device, but the second alignment chamber 200a may also be used.

The method of manufacturing a semiconductor device (S100) may include loading the wafer 90 into the first alignment chamber 200 of the plasma etching apparatus 400 (S105). The loading of the wafer 90 into the first alignment chamber 200 may be performed by using the first transfer robot 102.

A reference point of the wafer 90 may be rotated and changed or moved by rotating the wafer 90 mounted in the first alignment chamber 200 according to the plurality of heating zones HZ1 provided in the electrostatic chuck 1101 of the process chamber 308 (S110).

In an embodiment, the rotation of the wafer 90 may be performed according to etching distribution trend measured in the plurality of comparison wafers that have been plasma-etched in advance in the process chamber 308. In an embodiment, the rotation of the wafer 90 may be performed according to the number or the arrangement of the plurality of heating zones HZ1 and HZ2 arranged in the electrostatic chuck 1101 or 1101-1 of the process chamber 308. In an embodiment, the rotation of the wafer 90 may be performed according to the critical dimension measurement positions after the plasma-etching has been performed. The rotation of the wafer 90 according to the critical dimension measurement positions will be described in more detail below. The rotation and change of the reference point of the wafer 90 due to the rotation of the wafer 90 will be described in more detail below.

The wafer 90 rotated in the first alignment chamber 200 may be transferred onto the electrostatic chuck 1101 of the process chamber 308 (S115). The transfer of the wafer 90 may be performed by using the first transfer robot 102 and the second transfer robot 306.

The wafer 90 mounted on the electrostatic chuck 1101 in the process chamber 308 may be plasma-etched to complete the method of manufacturing the semiconductor device (S120). The plasma-etching process may include etching a material film formed on the wafer 90. In other words, the plasma-etching process may be an etching process for the material film formed on the wafer 90, for example, an oxide film or a nitride film.

Figure 9:
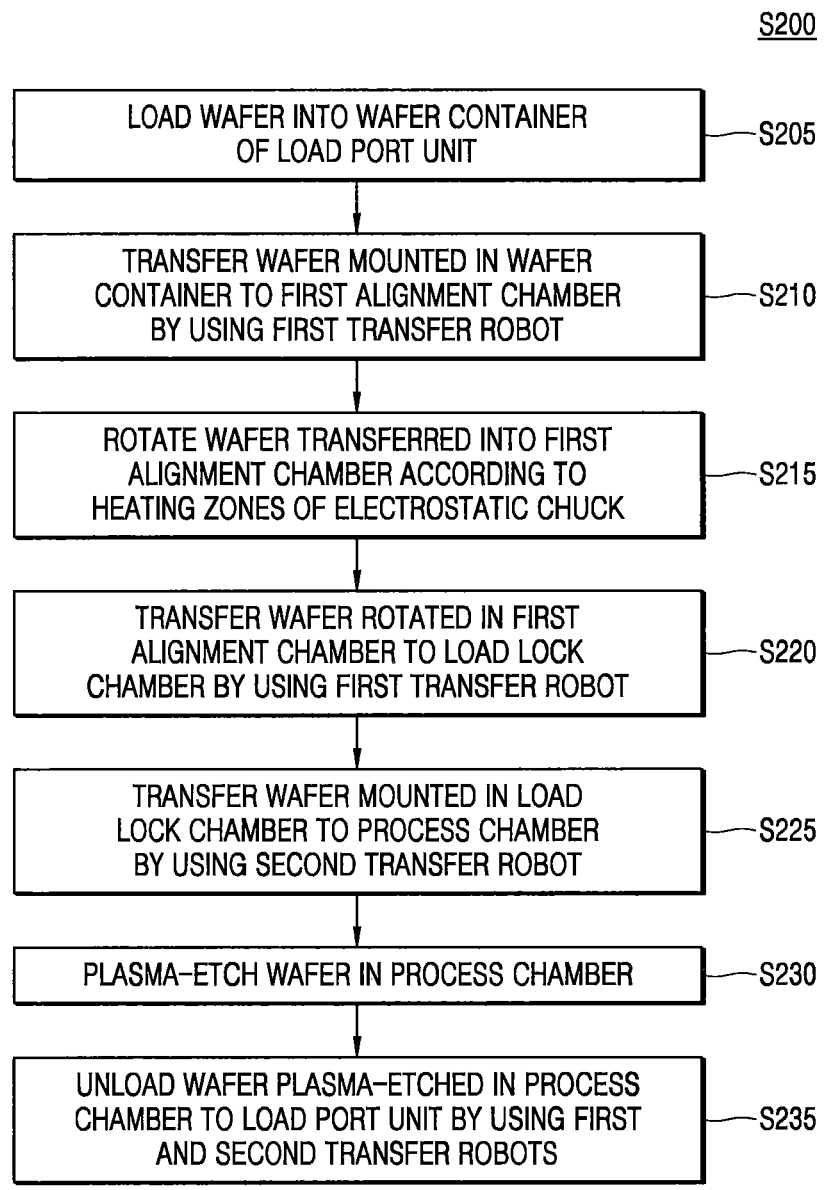
FIG. 9 is a flowchart for explaining a method of manufacturing a semiconductor device by using a plasma etching apparatus, according to an example of the technical idea of the inventive concept.

FIG. 9 is a flowchart for explaining a method of manufacturing a semiconductor device by using the plasma etching apparatus 400 according to an example of the technical idea of the inventive concept.

In the description with respect to FIG. 9, the same reference numerals as those in FIGS. 1 through 7 may denote the same elements. In the description with respect to FIG. 9, the same contents as those described with reference to FIGS. 1 through 7 may be briefly explained or omitted in the interest of brevity. The method of manufacturing a semiconductor device (S200) may be performed by using the plasma etching apparatus 400 including the first alignment chamber 200, the load lock chamber 302, and the process chamber 308. With reference to FIG. 9, the method of manufacturing a semiconductor device by using the first alignment chamber 200 will be described in detail.

The method of manufacturing a semiconductor device (S200) may include loading the wafer 90 into the wafer container 54 of the load port unit 50 of the plasma etching apparatus 400 (S205). The wafer 90 mounted on the wafer container 54 may be transferred to the first alignment chamber 200 by using the first transfer robot 102 (S210).

The wafer 90 transferred into the first alignment chamber 200 may be rotated according to the heating zones of the electrostatic chuck 1101 (S215). In other words, the reference point of the wafer 90 may be rotated and changed or moved by rotating the wafer 90 mounted in the first alignment chamber 200 according to the plurality of heating zones HZ1 arranged in the electrostatic chuck 1101 of the process chamber 308 (S110).

In addition, as described above, the wafer 90 in the first alignment chamber 200 may be rotated based on the etching distribution data and/or the critical dimension measurement position measured on the comparison wafer. The rotation and change of the reference point of the wafer 90 due to the rotation of the wafer 90 will be described in more detail below.

The wafer 90 rotated in the first alignment chamber 200 may be transferred to the load lock chamber 302 by using the first transfer robot 102 (S220). Then, the wafer 90 transferred to the load lock chamber 302 may be transferred into the process chamber 308 by using the second transfer robot 306 (S225). The wafer 90 transferred to the load lock chamber 302 may be transferred onto the electrostatic chuck 1101 of the process chamber 308 by using the second transfer robot 306.

The wafer 90 mounted on the electrostatic chuck 1101 in the process chamber 308 may be plasma-etched (S230). The plasma-etching process may include etching a material film formed on the wafer 90. In other words, the plasma-etching process may be an etching process for the material film formed on the wafer 90, for example, an oxide film or a nitride film.

Then, unloading the wafer 90 plasma-etched in the process chamber 308 onto the load port unit 50 by using the first and second transfer robots 102 and 306 may be included to complete a manufacturing process of a semiconductor device (S235).

Figure 10:
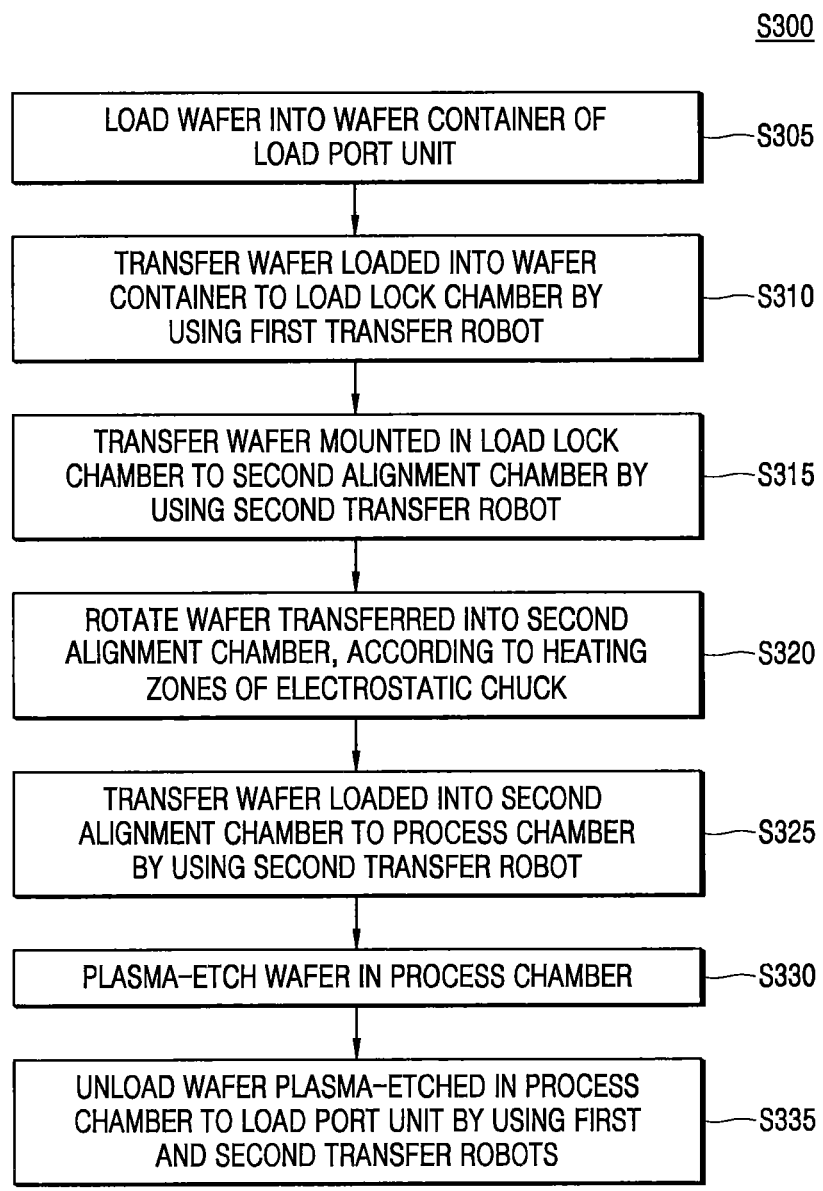
FIG. 10 is a flowchart for explaining a method of manufacturing a semiconductor device by using a plasma etching apparatus, according to an example of the technical idea of the inventive concept.

FIG. 10 is a flowchart for explaining a method of manufacturing a semiconductor device by using the plasma etching apparatus 400 according to an example of the technical idea of the inventive concept.

In the description with respect to FIG. 10, the same reference numerals as those in FIGS. 1 through 7 may denote the same elements. In the description with respect to FIG. 10, the same contents as those described with reference to FIGS. 1 through 7 may be briefly explained or omitted in the interest of brevity. The method of manufacturing a semiconductor device (S300) may be performed by using the plasma etching apparatus 400 including the second alignment chamber 200a, the load lock chamber 302, and the process chamber 308. With reference to FIG. 10, the method of manufacturing a semiconductor device by using the second alignment chamber 200a will be described in detail.

The method of manufacturing a semiconductor device (S300) may include loading the wafer 90 into the wafer container 54 of the load port unit 50 of the plasma etching apparatus 400 (S305). The wafer 90 mounted on the wafer container 54 may be transferred to the load lock chamber 302 by using the first transfer robot 102 (S310). The wafer 90 loaded in the load lock chamber 302 may be loaded into the second alignment chamber 200a by using the second transfer robot 306 (S315).

The wafer 90 transferred into the second alignment chamber 200a may be rotated according to the heating zones of the electrostatic chuck 1101 (S320). In other words, the reference point of the wafer 90 may be rotated and changed by rotating the wafer 90 mounted in the second alignment chamber 200a according to the plurality of heating zones HZ1 arranged in the electrostatic chuck 1101 of the process chamber 308.

In addition, as described above, the wafer 90 in the second alignment chamber 200a may be rotated based on the etching distribution data and/or the critical dimension measurement position measured on the comparison wafer. The rotation and change of the reference point of the wafer 90 due to the rotation of the wafer 90 will be described in more detail below.

The wafer 90 rotated in the second alignment chamber 200a may be transferred into the process chamber 308 by using the second transfer robot 306 (S325). The wafer 90 transferred from the second alignment chamber 200a may be transferred onto the electrostatic chuck 1101 of the process chamber 308 by using the second transfer robot 306.

The wafer 90 mounted on the electrostatic chuck 1101 in the process chamber 308 may be plasma-etched (S330). The plasma-etching process may include etching a material film formed on the wafer 90. Then, unloading the wafer 90 plasma-etched in the process chamber 308 onto the load port unit 50 by using the first and second transfer robots 102 and 306 may be included to complete a manufacturing process of a semiconductor device (S335).

Figure 11:
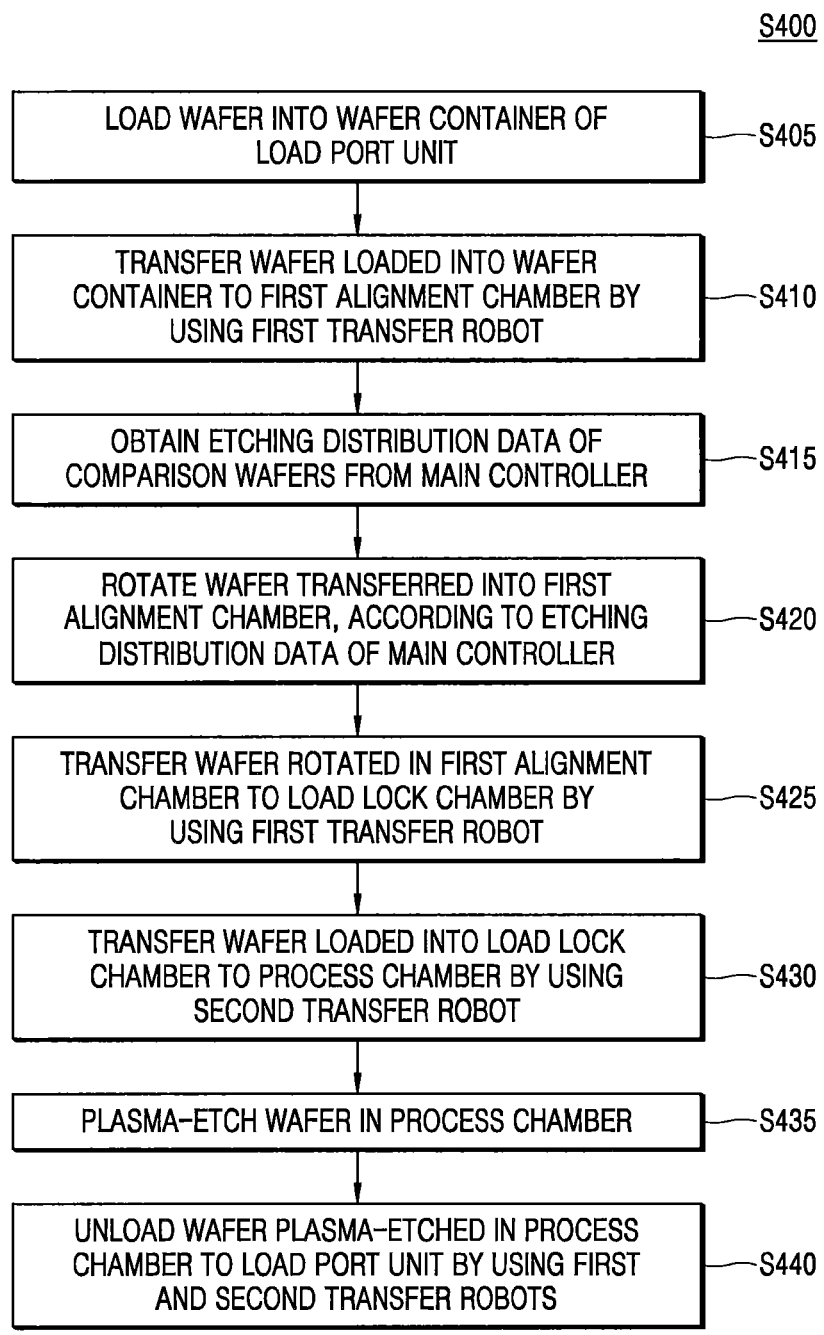
FIG. 11 is a flowchart for explaining a method of manufacturing a semiconductor device by using a plasma etching apparatus, according to an example of the technical idea of the inventive concept.

FIG. 11 is a flowchart for explaining a method of manufacturing a semiconductor device by using the plasma etching apparatus 400 according to an example of the technical idea of the inventive concept.

In the description with respect to FIG. 11, the same reference numerals as those in FIGS. 1 through 7 may denote the same elements. In the description with respect to FIG. 11, the same contents as those described with reference to FIGS. 1 through 7 may be briefly explained or omitted in the interest of brevity. The method of manufacturing a semiconductor device (S400) may be performed by using the plasma etching apparatus 400 including the first alignment chamber 200, the load lock chamber 302, and the process chamber 308. With reference to FIG. 11, the method of manufacturing a semiconductor device by using the first alignment chamber 200 will be described in detail.

The method of manufacturing a semiconductor device (S400) may include loading the wafer 90 into the wafer container 54 of the load port unit 50 of the plasma etching apparatus 400 (S405). The wafer 90 mounted on the wafer container 54 may be transferred to the first alignment chamber 200 by using the first transfer robot 102 (S410).

The etching distribution data measured on the plurality of comparison wafers that have been plasma-etched in the process chamber 308 may be obtained from the main controller 1250 of the plasma etching apparatus 400 (S415).

The wafer 90 transferred into the first alignment chamber 200 may be rotated based on the etching distribution data obtained from the main controller 1250 (S420). In other words, the reference point of the wafer 90 may be rotated and changed by rotating the wafer 90 mounted in the first alignment chamber 200 based on the etching distribution data obtained from the main controller 1250. In addition, as described above, the wafer 90 in the first alignment chamber 200 may be rotated based on the measurement positions of the critical dimension.

The rotation angle of the wafer 90 mounted in the first alignment chamber 200 may be adjusted by the alignment controller 210 connected to the main controller 1250. The etching distribution data obtained from the main controller 1250 of the plasma etching apparatus 400 may be fed back to the alignment controller 210 by software, so that the rotation angle of the wafer 90 may be automatically adjusted. The rotation and change of the reference point of the wafer 90 due to the rotation of the wafer 90 will be described in more detail below.

The wafer 90 rotated in the first alignment chamber 200 may be transferred to the load lock chamber 302 by using the first transfer robot 102 (S425). Then, the wafer 90 transferred to the load lock chamber 302 may be transferred into the process chamber 308 by using the second transfer robot 306 (S430). The wafer 90 transferred from the load lock chamber 302 may be transferred onto the electrostatic chuck 1101 of the process chamber 308 by using the second transfer robot 306.

The wafer 90 mounted on the electrostatic chuck 1101 in the process chamber 308 may be plasma-etched (S435). The plasma-etching process may include etching a material film formed on the wafer 90. In other words, the plasma-etching process may be an etching process for the material film formed on the wafer 90, for example, an oxide film or a nitride film.

Then, unloading the wafer 90 plasma-etched in the process chamber 308 onto the load port unit 50 by using the first and second transfer robots 102 and 306 may be included to complete a manufacturing process of a semiconductor device (S440).

Figure 12:
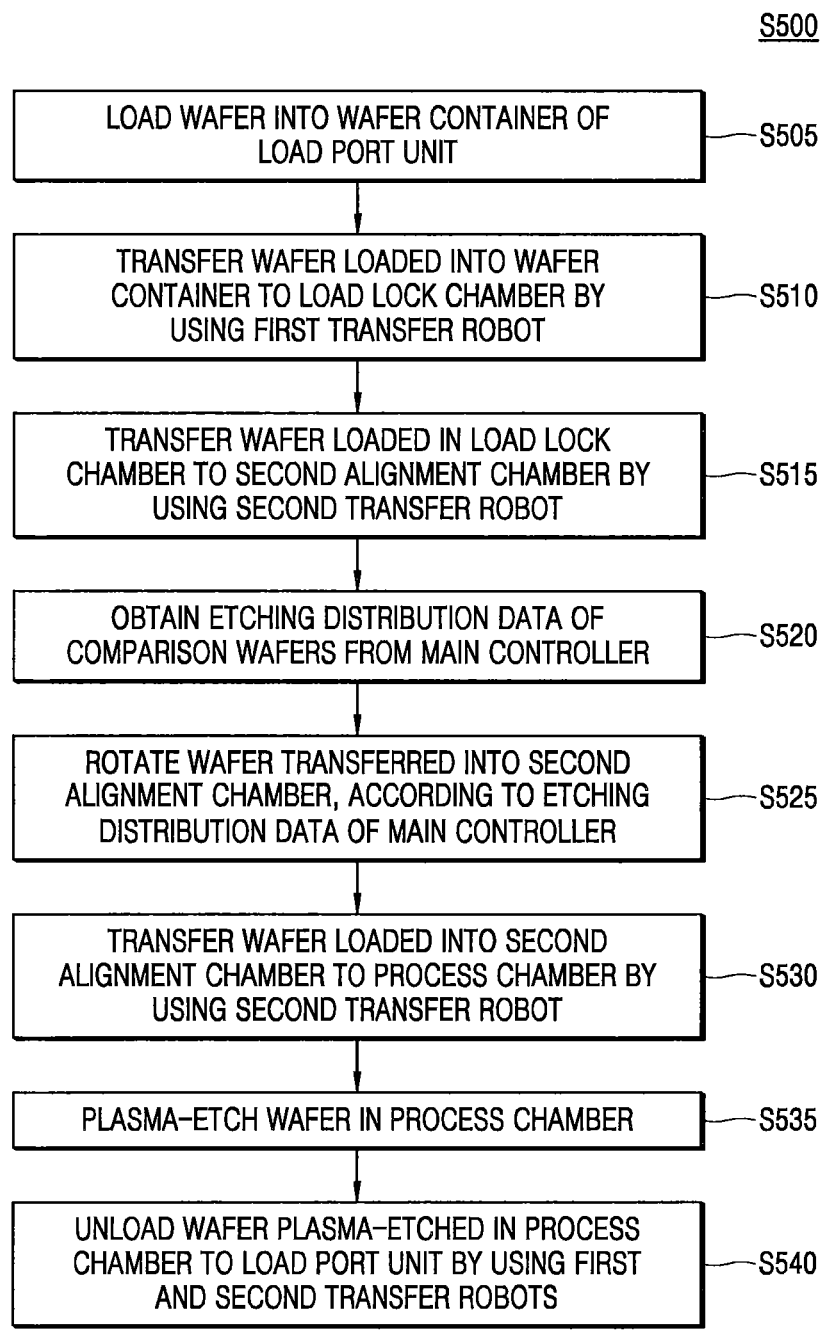
FIG. 12 is a flowchart for explaining a method of manufacturing a semiconductor device by using a plasma etching apparatus, according to an example of the technical idea of the inventive concept.

FIG. 12 is a flowchart for explaining a method of manufacturing a semiconductor device by using the plasma etching apparatus 400 according to an example of the technical idea of the inventive concept.

In the description with respect to FIG. 12, the same reference numerals as those in FIGS. 1 through 7 may denote the same elements. In the description with respect to FIG. 12, the same contents as those described with reference to FIGS. 1 through 7 may be briefly explained or omitted in the interest of brevity. The method of manufacturing a semiconductor device (S500) may be performed by using the plasma etching apparatus 400 including the second alignment chamber 200a, the load lock chamber 302, and the process chamber 308. With reference to FIG. 12, the method of manufacturing a semiconductor device by using the second alignment chamber 200a will be described in detail.

The method of manufacturing a semiconductor device (S500) may include loading the wafer 90 into the wafer container 54 of the load port unit 50 of the plasma etching apparatus 400 (S505). The wafer 90 mounted on the wafer container 54 may be transferred to the load lock chamber 302 by using the first transfer robot 102 (S510). The wafer 90 loaded in the load lock chamber 302 may be loaded into the second alignment chamber 200a by using the second transfer robot 306 (S515).

The etching distribution data measured on the plurality of comparison wafers that have been plasma-etched in the process chamber 308 may be obtained from the main controller 1250 of the plasma etching apparatus 400 (S520).

The wafer 90 transferred into the second alignment chamber 200a may be rotated based on the etching distribution data obtained from the main controller 1250 (S525). In other words, the reference point of the wafer 90 may be rotated and changed by rotating the wafer 90 mounted in the second alignment chamber 200a based on the etching distribution data obtained from the main controller 1250. In addition, as described above, the wafer 90 in the second alignment chamber 200a may be rotated based on the measurement positions of the critical dimension.

The rotation angle of the wafer 90 mounted in the second alignment chamber 200a may be adjusted by the alignment controller 210 connected to the main controller 1250. The etching distribution data obtained from the main controller 1250 of the plasma etching apparatus 400 may be fed back to the alignment controller 210 by software, so that the rotation angle of the wafer 90 may be automatically adjusted. The rotation and change of the reference point of the wafer 90 due to the rotation of the wafer 90 will be described in more detail below.

The wafer 90 rotated in the second alignment chamber 200a may be transferred into the process chamber 308 by using the second transfer robot 306 (S530). The wafer 90 transferred from the second alignment chamber 200a may be transferred onto the electrostatic chuck 1101 of the process chamber 308 by using the second transfer robot 306.

The wafer 90 mounted on the electrostatic chuck 1101 in the process chamber 308 may be plasma-etched (S535). The plasma-etching process may include etching a material film formed on the wafer 90. Then, unloading the wafer 90 plasma-etched in the process chamber 308 onto the load port unit 50 by using the first and second transfer robots 102 and 306 may be included to complete a manufacturing process of a semiconductor device (S540).

Figure 13A:
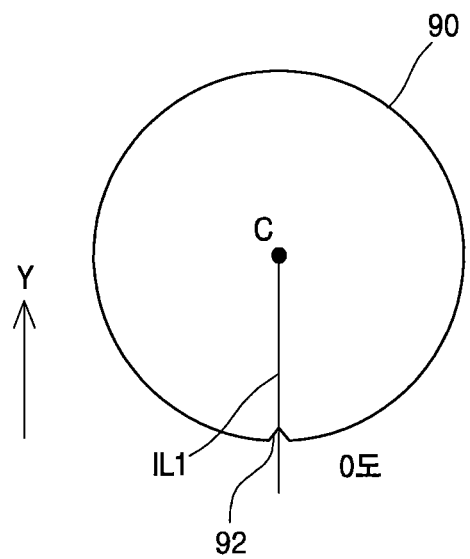
FIGS. 13A and 13B are plan views for explaining rotation of a wafer in an alignment chamber of a plasma etching apparatus, according to an example of the technical idea of the inventive concept.
Figure 13B:
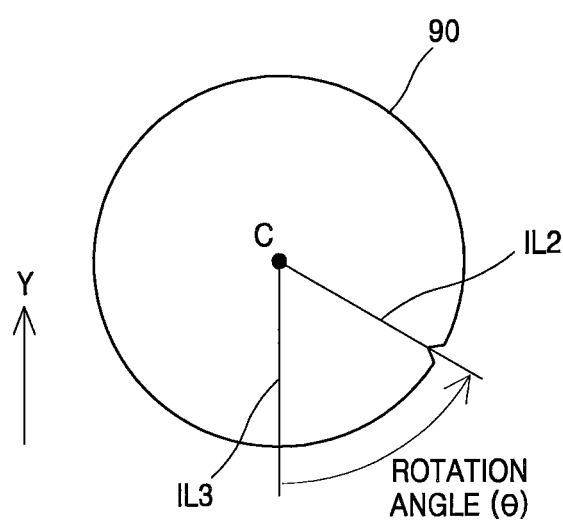

FIGS. 13A and 13B are plan views for explaining rotation of the wafer 90 in the first and second alignment chambers 200 and 200a of the plasma etching apparatus 400 according to an example of the technical idea of the inventive concept.

In the description with respect to FIGS. 13A and 13B, the same reference numerals as those in FIGS. 1 through 7 may denote the same elements. FIG. 13A shows a state in which the wafer 90 is not rotated, and FIG. 13B shows a state in which the wafer 90 is rotated by the rotation angle (θ).

The reference point of the wafer 90 may be a notch 92. In FIG. 13, the notch 92 is shown as the reference point of the wafer 90, but the reference point may be a flat zone or other portion of the wafer 90. When the wafer 90 is not rotated, a first imaginary line IL1 connecting or extending between the notch 92, which is the reference point of the wafer 90, and the center C of the wafer 90 as illustrated in FIG. 13A may be aligned in the Y direction. Thus, the rotation angle of the wafer 90 may be about 0. The Y direction may be a direction in which the first and second transfer robots (102 and 306 in FIG. 1) enter when transferring the wafer 90.

When the wafer 90 is rotated, the rotation angle (θ) may be an angle between the first imaginary line ILL which connects or extends between the notch 92 and the center C of the wafer 90 when the wafer 90 does not rotate, and a second imaginary line IL2, which connects or extends between the notch 92 rotated due to a rotation of the wafer 90 and the center C of the wafer 90. In other words, the rotational angle (θ) is an angle between a third imaginary line IL3, which connects or extends between a point from which the wafer 90 has rotated and the center C of the wafer 90, and the second imaginary line IL2, which connects or extends between the notch 92 rotated due to a rotation of the wafer 90 and the center C of the wafer 90. As described above, the rotation angle (θ) of the wafer 90 mounted in the first and second alignment chambers 200 and 200a may be adjusted by the alignment controller 210 that controls and/or is connected to the first and second alignment chambers 200 and 200a.

Figure 14:
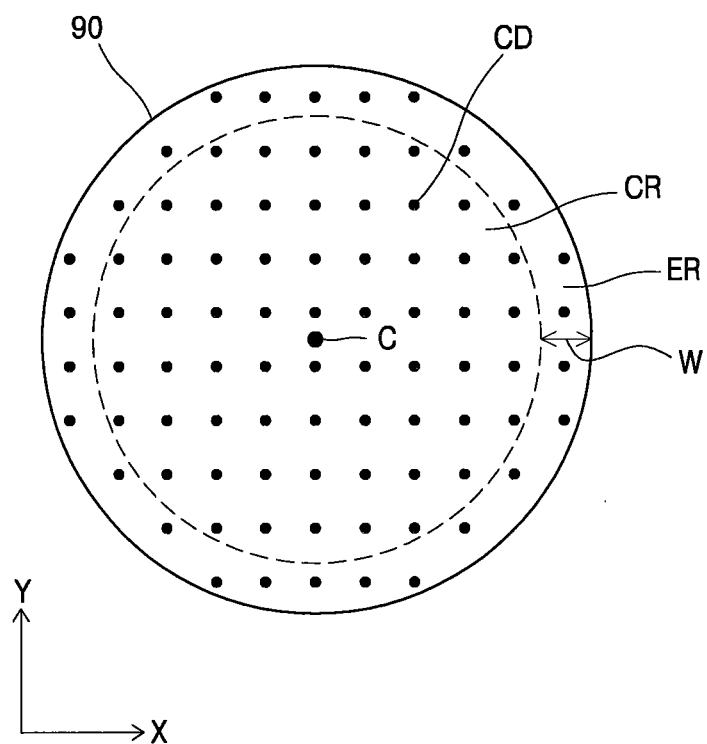
FIG. 14 illustrates a measurement position of a critical dimension of a wafer plasma-etched by a plasma etching apparatus, according to an example of the technical idea of the inventive concept.

FIG. 14 is a view for illustrating the critical dimension measurement positions of the wafer 90 plasma-etched by the plasma etching apparatus 400 according to an example of the technical idea of the inventive concept.

In the description with respect to FIG. 14, the same reference numerals as those in FIGS. 1 through 7 may denote the same elements. The critical dimension measurement positions of the wafer 90 which has been plasma-etched by the plasma etching apparatus 400 may be arranged in plurality at an equal interval in the X and Y directions as illustrated in FIG. 14. The number of measurement and a measurement array of the critical dimension measurement positions may be variously changed depending on a kind of the semiconductor device, a kind of the etching film, and the like. The wafer 90 may be distinguished into a central region CR surrounding the center C and an edge region ER surrounding the central region CR. For example, when a radius of the wafer 90 is about 300 mm, a width W of the edge region ER may be, for example, about 10 mm to 50 mm.

In addition, as described above in the inventive concept, the temperature of the electrostatic chuck 1101 may be precisely controlled by rotating the wafer 90 before loading the wafer 90 into the process chamber 308, without changing the number or the arrangement of the heating zones HZ1 of the electrostatic chuck 1101. Accordingly, the temperature of the electrostatic chuck 1101 in the central region CR or the edge region ER, and particularly the edge region ER of the wafer 90, may be controlled, and thus, the etching uniformity may be improved.

FIGS. 15A, 15B, 16A, and 16B are plan views for explaining heating zones HZa, HZb, HZc, HZd, and HZe of the electrostatic chuck 1101 corresponding to the critical dimension measuring positions CDa through CDh of the wafer 90 plasma-etched by the plasma etching apparatus 400 according to the technical idea of the inventive concept.

In the description with respect to FIGS. 15A, 15B, 16A, and 16B, the same reference numerals as those in FIGS. 1 through 7 may denote the same elements. FIGS. 15A, 15B, 16A, and 16B are views illustrating critical dimension measurement positions CDa through CDh corresponding to the electrostatic chuck 1101 of FIG. 6A.

As described, above with reference to FIG. 14, the critical dimension measurement positions CDa through CDh of the wafer 90 plasma-etched by the plasma etching apparatus 400 may be variously changed in the number of measurement and the measurement array depending on, for example, the kind of the semiconductor device or the kind of the etching layer material. The method of manufacturing a semiconductor device of the inventive concept may plasma-etch and then, rotate the wafer 90 mounted in the first alignment chamber 200 or the second alignment chamber 200a according to the critical dimension measurement positions and thereafter, perform plasma treatment, so that due to a difference in the critical dimensions CD, for example, the etching uniformity in the wafer 90 is improved.

Figure 15A:
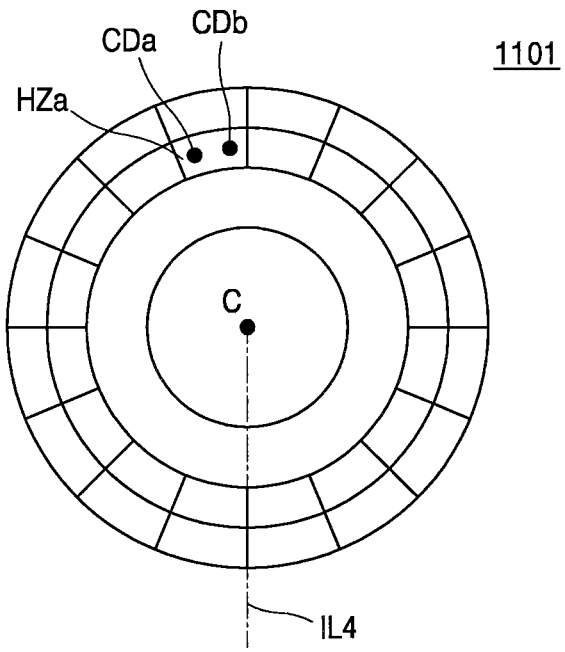
FIGS. 15A, 15B, 16A, and 16B are plan views for explaining heating zones of an electrostatic chuck corresponding to a critical dimension measuring position of a wafer plasma-etched by a plasma etching apparatus, according to an example of the technical idea of the inventive concept.

In an embodiment, the critical dimension measurement positions CDa and CDb are included in one heating zone HZa of the electrostatic chuck 1101 in FIG. 15A. At this time, when the difference between the critical dimensions CD measured at the critical dimension measurement positions CDa and CDb is large, it may be difficult to control the critical dimensions CD by adjusting a voltage applied to the heater electrode (1145 in FIG. 7) corresponding to one of the heating zone HZa. An imaginary line IL4 in FIG. 15A may be a line corresponding to the first imaginary line IL1 in FIG. 13A.

Figure 15B:
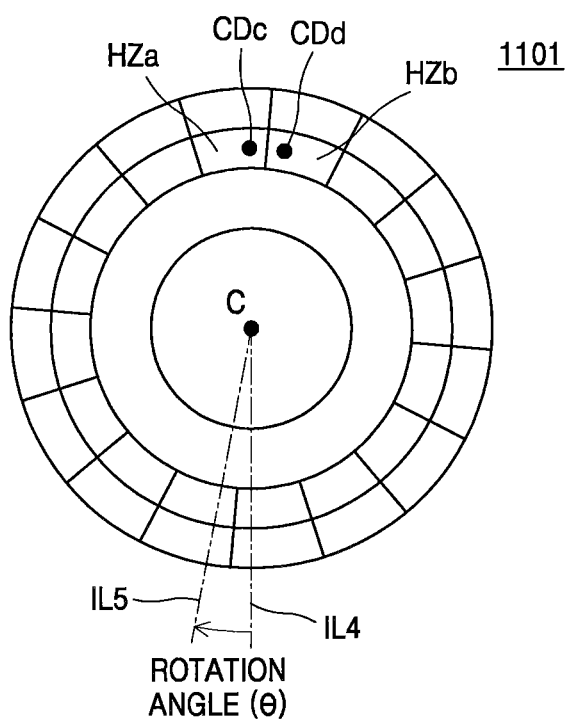

On the other hand, the wafer 90 may be rotated at or by a rotation angle (θ), as shown in FIG. 15B, such that two or more critical dimension measurement positions are not placed in any one of the plurality of heating zones arranged in the electrostatic chuck 1101 of the process chamber 308. The fourth imaginary line IL4 and a fifth imaginary line IL5 in FIG. 15B may be lines corresponding to the third and second imaginary lines IL3 and IL2 in FIG. 13B, respectively.

In this manner, the critical dimension measurement positions CDa and CDb may be included in the two heating zones HZa and HZb of the electrostatic chuck 1101, respectively. As a result, even when there is a large difference in the critical dimensions CD measured at the critical dimension measurement positions CDc and CDd, the critical dimension CD may be easily adjusted by adjusting voltages applied to the heater electrodes (1145 in FIG. 7) which correspond to the two heating zones HZa and HZb.

Figure 16A:
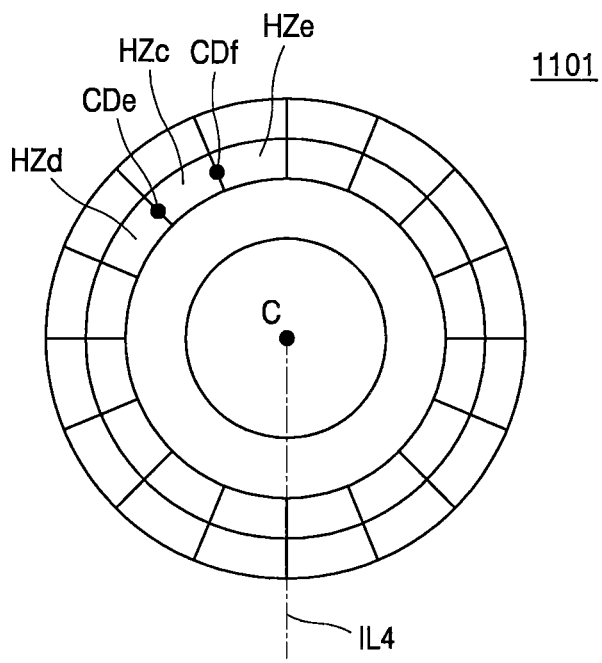

In an embodiment, the critical dimension measurement positions CDe and CDf may be located on boundaries of heating zones HZc through HZe of the electrostatic chuck 1101 in FIG. 16A. In this case, the critical dimensions CD measured at the critical dimension measurement positions CDe and CDf may not be easily adjusted by adjusting the voltages applied to the heater electrodes (1145 in FIG. 7) which correspond to the three heating zones HZc through HZe. The fourth imaginary line IL4 in FIG. 16A may be a line corresponding to the first imaginary line IL1 in FIG. 13A.

Figure 16B:
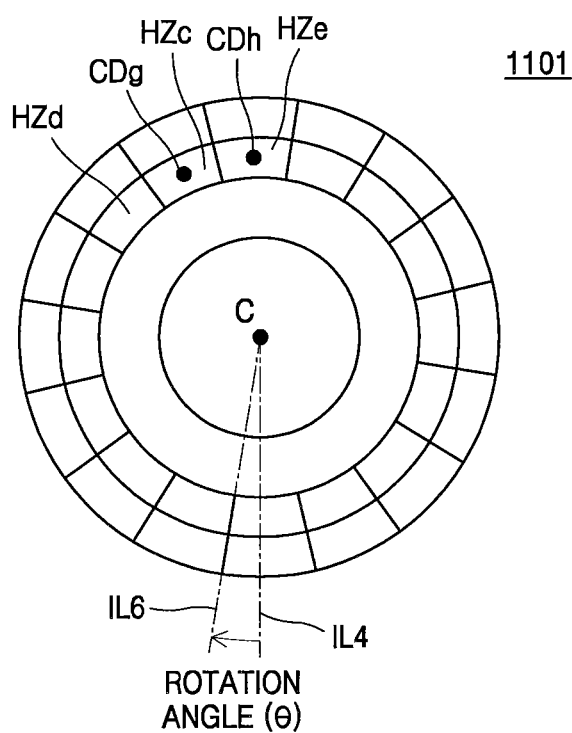

On the other hand, the wafer 90 may be rotated at or by a rotation angle (θ), as shown in FIG. 16B, such that the critical dimension measurement position is not placed on the boundaries of the plurality of heating zones HZc through HZe arranged in the electrostatic chuck 1101 of the process chamber 308. The fourth imaginary line IL4 and a sixth imaginary line IL6 in FIG. 16B may be lines corresponding to the third and second imaginary lines IL3 and IL2 in FIG. 13B, respectively.

In this manner, the critical dimension measurement positions CDg and CDh may be included in the two heating zones HZc and HZe of the electrostatic chuck 1101, respectively. Critical dimension measurement positions CDg and CDh may be easily adjusted by adjusting the voltages applied to the heater electrodes (1145 in FIG. 7) which correspond to the two heating zones HZc and HZe.

While the inventive concept has been particularly shown and described with reference to example embodiments thereof, it will be understood by one of ordinary skill in the art that various modifications, permutations, and other equivalent embodiments may be made therein without departing from the spirit and scope of the inventive concept as defined by the following claims. It should be understood that the above-described embodiments are illustrative and non-restrictive in every respect. Accordingly, the true scope of protection of the inventive concept should be determined by the technical idea of the following claims.

What is claimed is:

1. A method of manufacturing a semiconductor device by using a plasma etching apparatus comprising an alignment chamber and a process chamber, the method comprising:
   loading a wafer in the alignment chamber of the plasma etching apparatus;
   rotating the wafer loaded in the alignment chamber with respect to a plurality of heating zones arranged in an electrostatic chuck of the process chamber, thereby rotating a reference point of the wafer;
   transferring the wafer that was rotated in the alignment chamber onto the electrostatic chuck of the process chamber; and
   plasma-etching the wafer that was rotated in the alignment chamber on the electrostatic chuck of the process chamber,
   wherein the wafer loaded in the alignment chamber is rotated with respect to an array of critical dimension measurement positions that are predetermined on the wafer,
   wherein the wafer loaded in the alignment chamber is rotated such that no more than one of the critical dimension measurement positions is located in any one of the plurality of heating zones arranged in the electrostatic chuck of the process chamber.

2. The method of claim 1, wherein the wafer loaded in the alignment chamber is rotated based on an etching distribution trend measured from a plurality of comparison wafers that have been plasma-etched in advance in the process chamber before loading the wafer in the alignment chamber.

3. The method of claim 1, wherein the wafer loaded in the alignment chamber is rotated with respect to a number or an arrangement of the plurality of heating zones arranged in the electrostatic chuck of the process chamber.

4. The method of claim 1, wherein the wafer loaded in the alignment chamber is rotated such that the critical dimension measurement positions are not located on boundaries between adjacent ones of the plurality of heating zones arranged in the electrostatic chuck of the process chamber.

5. The method of claim 1, wherein a rotation angle of the wafer loaded in the alignment chamber is adjusted by an alignment controller that controls the alignment chamber.

6. The method of claim 5, wherein the reference point of the wafer is a notch, the rotation angle is an angle between a first imaginary line and a second imaginary line, the first imaginary line extending between the notch and a center of the wafer, and the second imaginary line extending between the notch that has been rotated and the center of the wafer.

7. A method of manufacturing a semiconductor device by using a plasma etching apparatus comprising an alignment chamber and a process chamber, the method comprising:
   loading a wafer in the alignment chamber of the plasma etching apparatus;
   obtaining, from a main controller of the plasma etching apparatus, etching distribution data measured from a plurality of comparison wafers that have been plasma-etched in advance in the process chamber;
   rotating the wafer loaded in the alignment chamber based on the etching distribution data, thereby rotating a reference point of the wafer;
   transferring the wafer that was rotated in the alignment chamber onto an electrostatic chuck of the process chamber; and
   plasma-etching the wafer on the electrostatic chuck of the process chamber.

8. The method of claim 7, wherein a rotation angle of the wafer loaded in the alignment chamber is adjusted by an alignment controller controlled by the main controller, and the etching distribution data obtained from the main controller of the plasma etching apparatus is provided to the alignment controller, so as to automatically adjust the rotation angle of the wafer.

9. The method of claim 7, wherein the wafer loaded in the alignment chamber is rotated with respect to an array of critical dimension measurement positions that are predetermined on the wafer.

10. The method of claim 9, wherein the wafer loaded in the alignment chamber is rotated such that the critical dimension measurement positions are not located on boundaries between adjacent ones of a plurality of heating zones arranged in the electrostatic chuck of the process chamber.

11. The method of claim 9, wherein the wafer loaded in the alignment chamber is rotated such that no more than one of the critical dimension measurement positions is located in any one of a plurality of heating zones arranged in the electrostatic chuck of the process chamber.

12. A method of manufacturing a semiconductor device, the method comprising:
    loading a wafer into a wafer container of a load port unit of a plasma etching apparatus;
    transferring the wafer loaded in the wafer container to a first alignment chamber using a first transfer robot;
    rotating the wafer loaded in the first alignment chamber with respect to a plurality of heating zones arranged in an electrostatic chuck of a process chamber, thereby rotating a reference point of the wafer;
    loading the wafer that was rotated in the first alignment chamber into a load lock chamber of the plasma etching apparatus using the first transfer robot;
    transferring the wafer from the load lock chamber, using a second transfer robot in a transfer chamber, onto the electrostatic chuck of the process chamber in which the plurality of heating zones are arranged; and
    plasma-etching the wafer on the electrostatic chuck inside the process chamber,
    wherein the wafer loaded in the first alignment chamber is rotated with respect to an array of critical dimension measurement positions on the wafer,
    wherein the wafer loaded in the first alignment chamber is rotated such that no more than one of the critical dimension measurement positions is located in any one of the plurality of heating zones arranged in the electrostatic chuck of the process chamber.

13. The method of claim 12, wherein the wafer loaded in the first alignment chamber is rotated based on an etching distribution trend measured from a plurality of comparison wafers that have been plasma-etched in advance in the process chamber.

14. The method of claim 12, wherein the wafer loaded in the first alignment chamber is rotated with respect to a number or an arrangement of the plurality of heating zones arranged in the electrostatic chuck of the process chamber.

15. The method of claim 12, wherein a second alignment chamber is connected to the transfer chamber, and
    the method further comprises, after the plasma-etching has been performed, transferring the wafer to and loading the wafer in the second alignment chamber, rotating the reference point of the wafer by rotating the wafer loaded in the second alignment chamber, and transferring the wafer that was rotated in the second alignment chamber to the process chamber using the second transfer robot.

16. The method of claim 15, wherein the wafer loaded in the second alignment chamber is rotated with respect to the array of critical dimension measurement positions.

17. The method of claim 16, wherein the wafer loaded in the second alignment chamber is rotated such that the critical dimension measurement positions are not located on boundaries between adjacent ones of the plurality of heating zones arranged in the electrostatic chuck of the process chamber.

18. The method of claim 16, wherein the wafer loaded in the second alignment chamber is rotated such that no more than one of the critical dimension measurement positions is located in any one of the plurality of heating zones arranged in the electrostatic chuck of the process chamber.

19. The method of claim 12, wherein the wafer loaded in the first alignment chamber is rotated such that the critical dimension measurement positions are not located on boundaries between adjacent ones of the plurality of heating zones arranged in the electrostatic chuck of the process chamber.

* * * * *